US011171124B2

(12) United States Patent
Lo et al.

(10) Patent No.: US 11,171,124 B2
(45) Date of Patent: Nov. 9, 2021

(54) LIGHT-EMITTING SUBSTRATE AND REPAIR METHOD THEREOF

(71) Applicant: Au Optronics Corporation, Hsinchu (TW)

(72) Inventors: Kuo-Lung Lo, Hsinchu County (TW); Tsung-Tien Wu, Hsinchu County (TW); Pin-Miao Liu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 32 days.

(21) Appl. No.: 16/503,493

(22) Filed: Jul. 4, 2019

(65) Prior Publication Data

US 2020/0168585 A1    May 28, 2020

(30) Foreign Application Priority Data

Nov. 26, 2018   (TW) .................................. 107142077

(51) Int. Cl.
*H01L 25/04*    (2014.01)
*H01L 25/075*   (2006.01)
*H01L 25/16*    (2006.01)

(52) U.S. Cl.
CPC ........ *H01L 25/0753* (2013.01); *H01L 25/167* (2013.01)

(58) Field of Classification Search
CPC ............. H01L 2924/00; H01L 25/0753; H01L 2927/0002; H01L 33/62; H01L 25/167; H01L 33/0095; H01L 2933/0066; H01L 27/156; H01L 2924/00014; H01L 2224/48091
See application file for complete search history.

(56) References Cited

U.S. PATENT DOCUMENTS

2012/0218318 A1*   8/2012   Hirao ...................... H01L 24/36
                                                                345/690
2014/0111559 A1*   4/2014   Yang .................... G09G 3/2088
                                                                345/690
(Continued)

FOREIGN PATENT DOCUMENTS

CN          105023522       11/2015
TW          I641126         11/2018

*Primary Examiner* — Samuel Park
(74) *Attorney, Agent, or Firm* — JCIPRNET

(57) ABSTRACT

A light-emitting substrate and a repair method thereof are provided. The light-emitting substrate includes a substrate, a first conductive line, a second conductive line, a signal line, an insulating layer, first to third light-emitting devices, and a first sub-conductive line. The first and second conductive lines and the signal line are disposed on the substrate. The insulating layer is disposed on the first and second conductive lines. The first to third light-emitting devices are disposed on the substrate. The first light-emitting device is disposed corresponding to the first conductive line. The second light-emitting device is disposed corresponding to the second conductive line. The first to third light-emitting devices are disposed corresponding to the signal line. The first sub-conductive line is disposed on the insulating layer. The first sub-conductive line is overlapped with the first and second conductive lines. The third light-emitting device is disposed corresponding to the first sub-conductive line.

12 Claims, 18 Drawing Sheets

(56) References Cited

U.S. PATENT DOCUMENTS

| | | | |
|---|---|---|---|
| 2015/0279822 A1* | 10/2015 | Hsu | H01L 25/0753 |
| | | | 257/89 |
| 2015/0295140 A1* | 10/2015 | Aoyagi | H01L 31/0203 |
| | | | 257/99 |
| 2016/0351092 A1 | 12/2016 | Chen et al. | |
| 2016/0351548 A1* | 12/2016 | Chen | H01L 25/0753 |
| 2017/0186740 A1* | 6/2017 | Cok | H01L 22/14 |
| 2017/0256522 A1* | 9/2017 | Cok | H01L 27/3255 |
| 2019/0043844 A1* | 2/2019 | Liu | H01L 25/0753 |
| 2019/0172761 A1 | 6/2019 | Guo et al. | |
| 2020/0052033 A1* | 2/2020 | Iguchi | H01L 27/1225 |
| 2020/0066688 A1* | 2/2020 | Tazawa | H01L 33/62 |
| 2020/0219436 A1* | 7/2020 | Singer | G09G 3/32 |

* cited by examiner

LIGHT-EMITTING SUBSTRATE AND REPAIR METHOD THEREOF

CROSS-REFERENCE TO RELATED APPLICATION

This application claims the priority benefit of Taiwan application serial no. 107142077, filed on Nov. 26, 2018. The entirety of the above-mentioned patent application is hereby incorporated by reference herein and made a part of this specification.

BACKGROUND OF THE INVENTION

Field of the Invention

The invention relates to a light-emitting substrate, and more particularly, to a light-emitting substrate for which a sub-conductive line is overlapped with a conductive line and a repair method thereof.

Description of Related Art

A light-emitting diode (LED) is a light-emitting device with characteristics such as low power consumption, high brightness, high resolution, and high color saturation, which is suitable for constructing a pixel structure of a light-emitting diode display panel.

The technique of transporting light-emitting diodes onto a drive substrate having a pixel circuit is called mass transfer. In the prior art, when the light-emitting diodes are transferred, the issue of transfer error of the light-emitting diodes is likely to occur, such that some of the pixels in the display device cannot operate normally, which seriously affects the display quality of the display device. In addition, if the light-emitting diodes themselves have a defect and cannot function normally, then even if the light-emitting diodes are successfully transferred, the display quality of the display device is still affected. In order to alleviate the aforementioned issues, space is often reserved in the pixels to place additional light-emitting diodes. In general, each light-emitting diode in the pixel is combined with one additional reserved space, so that the pixel may operate even in the case that a small portion of the light-emitting diodes fail. However, the reserved spaces for placing additional light-emitting diodes makes it difficult to reduce the size of the pixels, which limits the resolution of the display device.

SUMMARY OF THE INVENTION

The invention provides a light-emitting substrate that may alleviate the effect on resolution from a space reserved for repair.

The invention provides a repair method of a light-emitting substrate that may alleviate the effect on resolution from a space reserved for repair.

At least one embodiment of the invention provides a light-emitting substrate including a substrate, a first conductive line, a second conductive line, a signal line, an insulating layer, a first light-emitting device, a second light-emitting device, a third light-emitting device, and a first sub-conductive line. The first and second conductive lines and the signal line are disposed on the substrate. The insulating layer is disposed on the first conductive line and the second conductive line. The first light-emitting device, the second light-emitting device, and the third light-emitting device are disposed on the substrate. The first light-emitting device is disposed corresponding to the first conductive line. The second light-emitting device is disposed corresponding to the second conductive line. The first light-emitting device, the second light-emitting device, and the third light-emitting device are disposed corresponding to the signal line. The first sub-conductive line is disposed on the insulating layer. The first sub-conductive line is overlapped with the first conductive line and the second conductive line in a direction perpendicular to the substrate. The third light-emitting device is disposed corresponding to the first sub-conductive line.

At least one embodiment of the invention provides a light-emitting substrate including a substrate, a first conductive line, a second conductive line, a signal line, an insulating layer, a third light-emitting device, and a first sub-conductive line. The substrate has a first light-emitting device placement area, a second light-emitting device placement area, and a third light-emitting device placement area. The first and second conductive lines and the signal line are disposed on the substrate. The insulating layer is disposed on the first conductive line and the second conductive line. The third light-emitting device is disposed on the third light-emitting device placement area. The first light-emitting device placement area is disposed corresponding to the first conductive line. The second light-emitting device placement area is disposed corresponding to the second conductive line. The first light-emitting device placement area, the second light-emitting device placement area, and the third light-emitting device are disposed corresponding to the signal line. The first sub-conductive line is disposed on the insulating layer. The first sub-conductive line is overlapped with the first conductive line and the second conductive line in a direction perpendicular to the substrate. The third light-emitting device is disposed corresponding to the first sub-conductive line.

At least one embodiment of the invention provides a repair method of a light-emitting substrate, including the following steps. A light-emitting substrate is provided. A first sub-conductive line and a first conductive line are electrically connected. The light-emitting substrate includes a substrate, a first conductive line, a second conductive line, a signal line, an insulating layer, a third light-emitting device, and a first sub-conductive line. The substrate has a first light-emitting device placement area, a second light-emitting device placement area, and a third light-emitting device placement area. The first and second conductive lines and the signal line are disposed on the substrate. The insulating layer is disposed on the first conductive line and the second conductive line. The third light-emitting device is disposed on the third light-emitting device placement area. The first light-emitting device placement area is disposed corresponding to the first conductive line. The second light-emitting device placement area is disposed corresponding to the second conductive line. The first light-emitting device placement area, the second light-emitting device placement area, and the third light-emitting device are disposed corresponding to the signal line. The first sub-conductive line is disposed on the insulating layer. The first sub-conductive line is overlapped with the first conductive line and the second conductive line in a direction perpendicular to the substrate. The third light-emitting device is disposed corresponding to the first sub-conductive line.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1D are top views of a method of fabricating a light-emitting substrate in accordance with an embodiment of the invention. FIG. 1E to FIG. 1F are top views of a repair method of a light-emitting substrate in accordance with an embodiment of the invention. FIG. 2A is a cross section of line AA' of FIG. 1F. FIG. 2B is a cross section of line BB' of FIG. 1F.

Figure 1A:
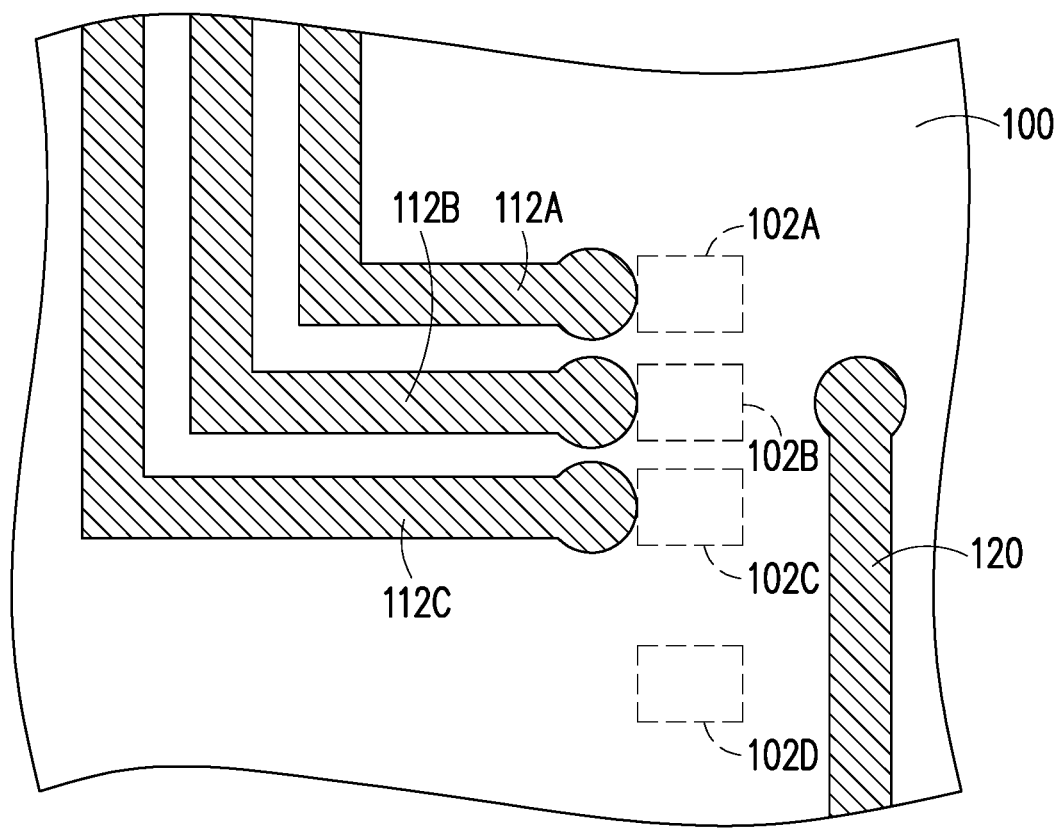
FIG. 1A to FIG. 1D are top views of a method of fabricating a light-emitting substrate in accordance with an embodiment of the invention.
Figure 2A:
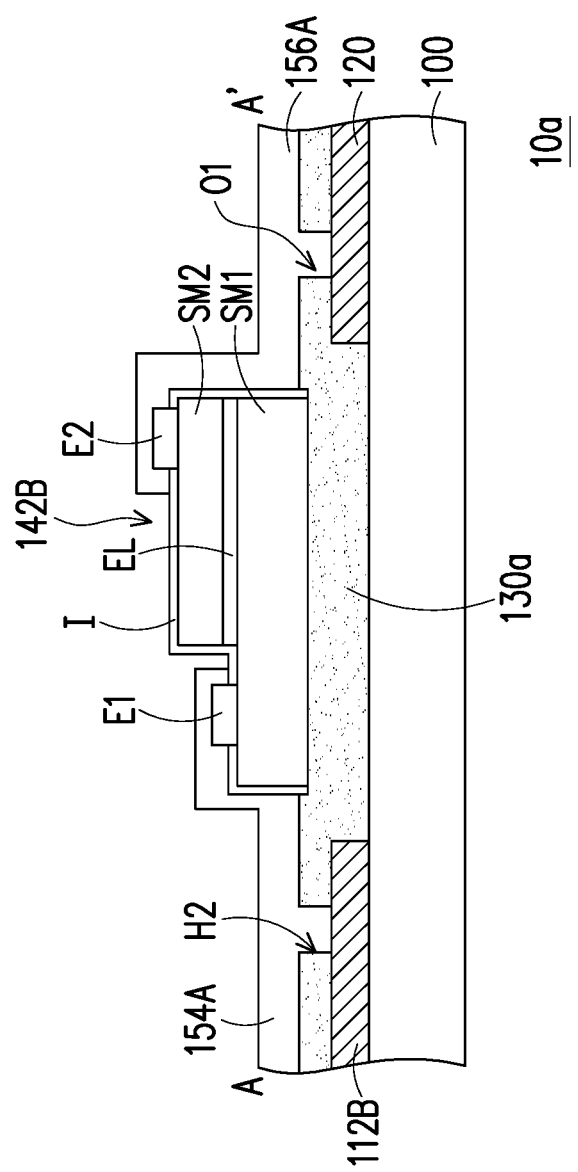
FIG. 2A is a cross section of line AA' of FIG. 1F.
Figure 2B:
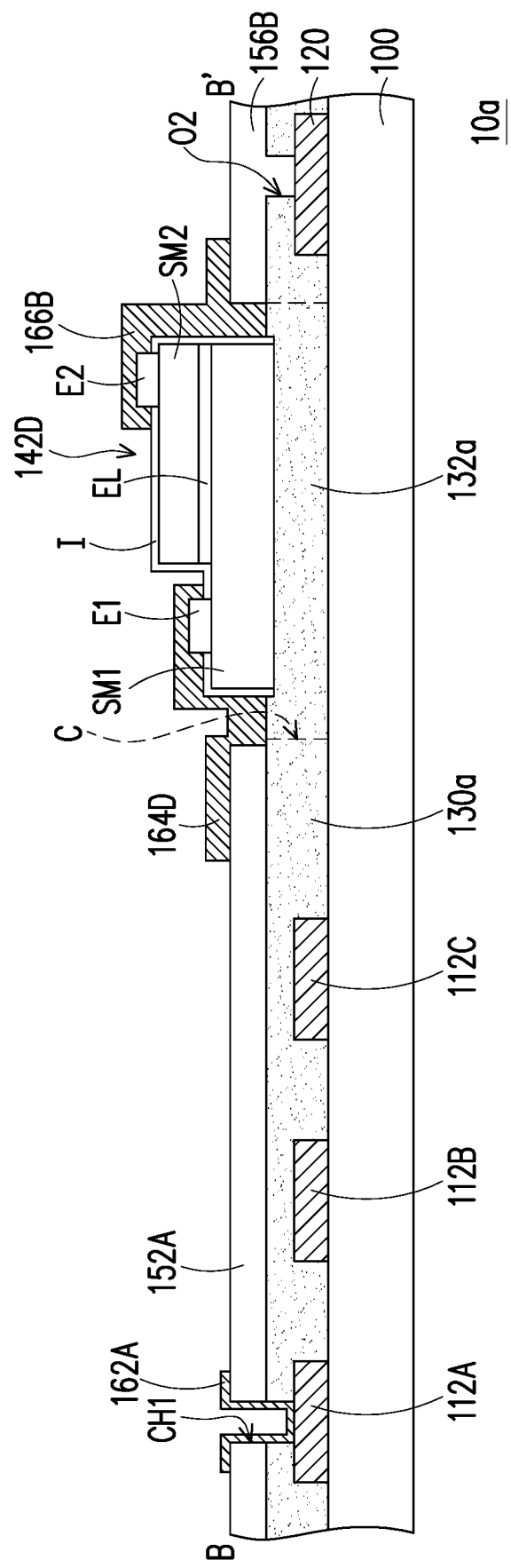
FIG. 2B is a cross section of line BB' of FIG. 1F.

Referring to FIG. 1A, a first conductive line 112A, a second conductive line 112B, a third conductive line 112C, and a signal line 120 are formed on a substrate 100. In some embodiments, the first conductive line 112A, the second conductive line 112B, and the third conductive line 112C respectively correspond to three different sub-pixel drive circuits, and the first conductive line 112A, the second conductive line 112B, and the third conductive line 112C are electrically connected to switch devices, a chip and/or other drive circuits, but the invention is not limited thereto.

The substrate 100 has a first light-emitting device placement area 102A, a second light-emitting device placement area 102B, a third light-emitting device placement area 102C, and a fourth light-emitting device placement area 102D. The first light-emitting device placement area 102A corresponds to the position of the first conductive line 112A, the second light-emitting device placement area 102B corresponds to the position of the second conductive line 112B, the third light-emitting device placement area 102C corresponds to the position of the third conductive line 112C, and the first light-emitting device placement area 102A, the second light-emitting device placement area 102B, the third light-emitting device placement area 102C, and the fourth light-emitting device placement area 102D all correspond to the position of the signal line 120.

Figure 1B:
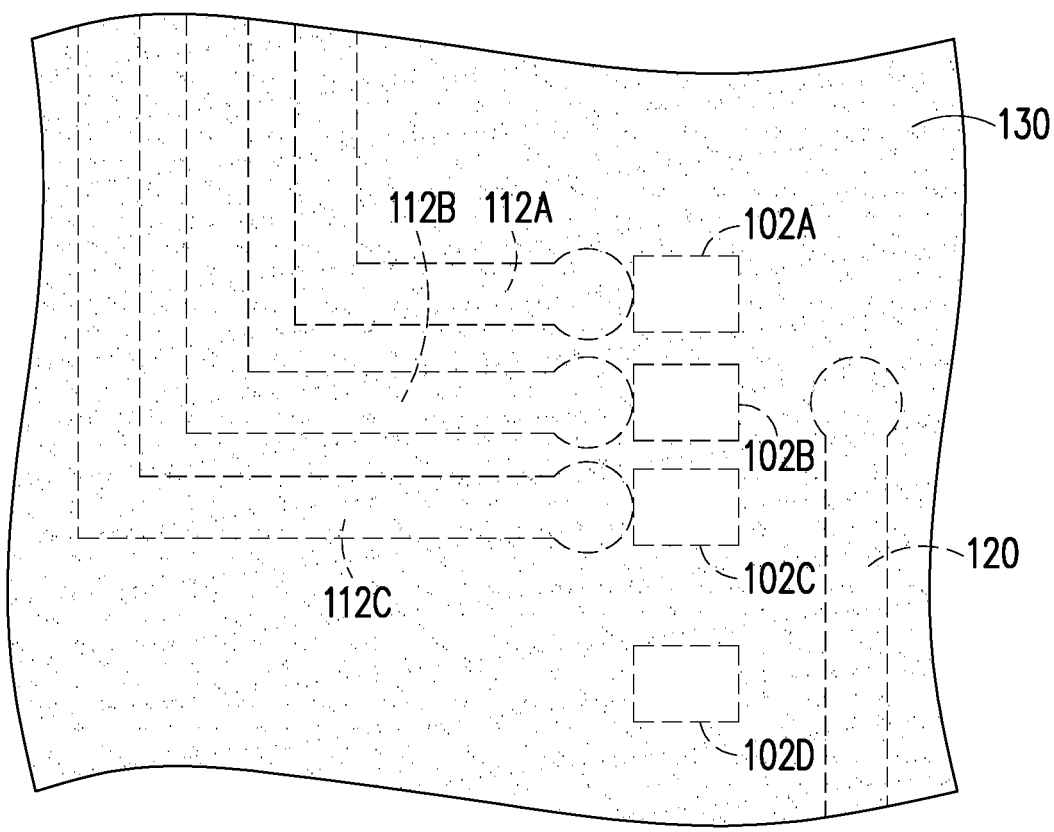

Referring to FIG. 1B, an adhesive layer 130 is formed on the first conductive line 112A, the second conductive line 112B, the third conductive line 112C, and the signal line 120.

Figure 1C:
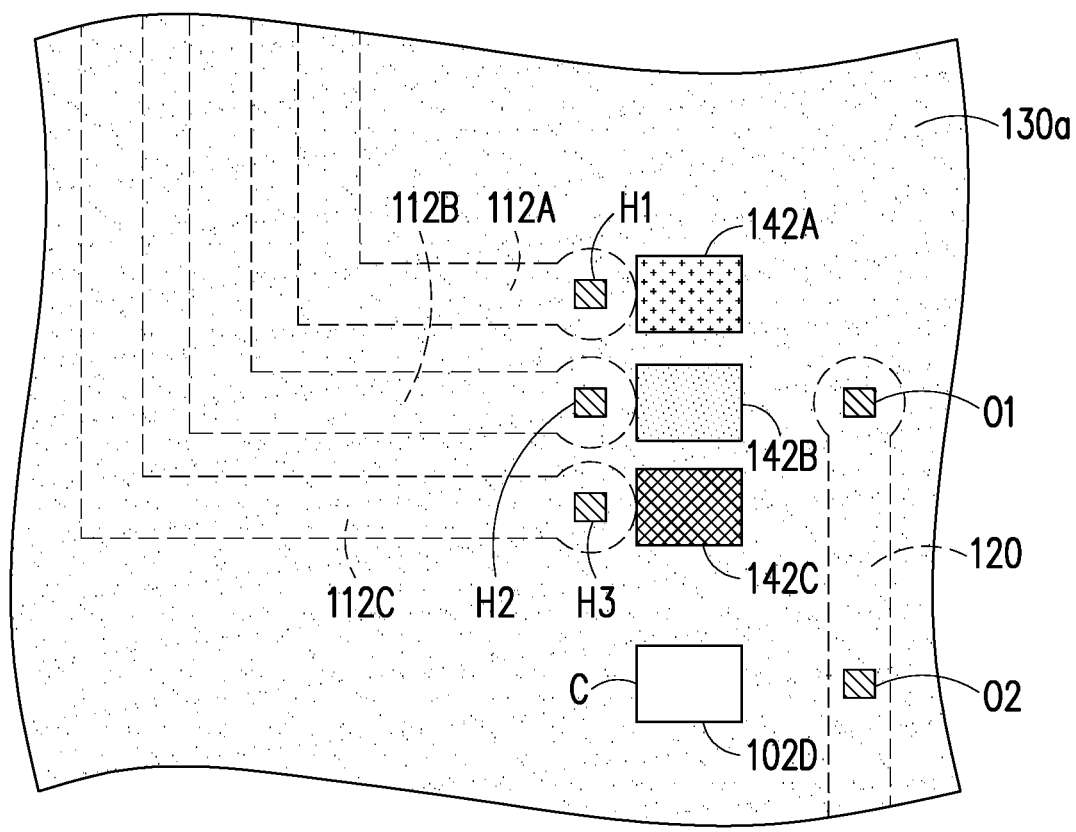

Referring to FIG. 1C, a first light-emitting device 142A, a second light-emitting device 142B, and a third light-emitting device 142C are transferred onto the first light-emitting device placement area 102A, the second light-emitting device placement area 102B, and the third light-emitting device placement area 102C of the substrate 100. The first light-emitting device 142A is disposed corresponding to the first conductive line 112A, the second light-emitting device 142B is disposed corresponding to the second conductive line 112B, the third light-emitting device 142C is disposed corresponding to the third conductive line 112C, and the first light-emitting device 142A, the second light-emitting device 142B, and the third light-emitting device 142C are disposed corresponding to the signal line 120.

In the present embodiment, the first light-emitting device 142A, the second light-emitting device 142B, and the third light-emitting device 142C respectively include a red light-emitting diode, a green light-emitting diode, and a blue light-emitting diode, but the invention is not limited thereto. The light-emitting device transferred onto the substrate 100 may also include light-emitting diodes of other colors.

Openings H1 to H3 are formed in the adhesive layer 130 to expose the first conductive line 112A, the second conductive line 112B, and the third conductive line 112C below the adhesive layer 130, respectively. Openings O1 and O2 are formed in the adhesive layer 130 to expose the signal line 120 below the adhesive layer 130. Optionally, an opening C is formed in the adhesive layer 130, and the opening C corresponds to the position of the fourth light-emitting device placement area 102D. The adhesive layer 130 is cured to form an insulating layer 130a. The insulating layer 130a is disposed on the first conductive line 112A, the second conductive line 112B, the third conductive line 112C, and the signal line 120.

In the present embodiment, the openings are formed in the adhesive layer 130 first, and then the adhesive layer 130 is cured, but the invention is not limited thereto. In other embodiments, the adhesive layer 130 is first cured and then the openings are formed in the cured adhesive layer 130 (the insulating layer 130a).

In the present embodiment, the first light-emitting device 142A, the second light-emitting device 142B, and the third light-emitting device 142C respectively include a first semiconductor layer SM1, a second semiconductor layer SM2, a first electrode E1, a second electrode E2, an insulating layer I, and a light-emitting layer EL (shown in FIG. 2A). The first semiconductor layer SM1, the light-emitting layer EL, and the second semiconductor layer SM2 are stacked on each other. The light-emitting layer EL is disposed between the first semiconductor layer SM1 and the second semiconductor layer SM2. The first electrode E1 and the second electrode E2 are electrically connected to the first semiconductor layer SM1 and the second semiconductor layer SM2, respectively. The insulating layer I covers a portion of the surface of the first semiconductor layer SM1 and a portion of the surface of the second semiconductor layer SM2. The first light-emitting device 142A, the second light-emitting device 142B, and the third light-emitting device 142C include, for example, different semiconductor materials or light-emitting layer materials, whereby light of different colors may be emitted.

Figure 1D:
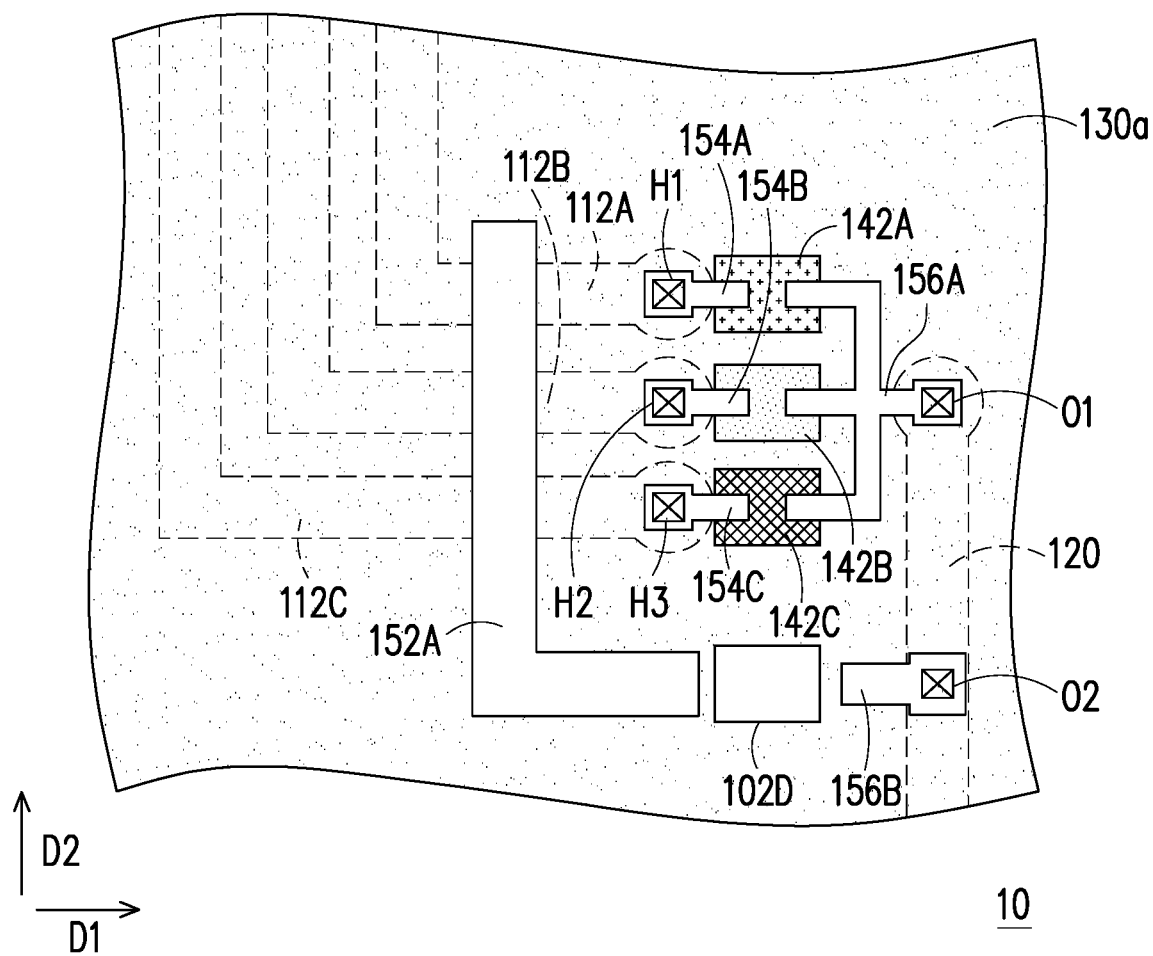
Figure 1E:
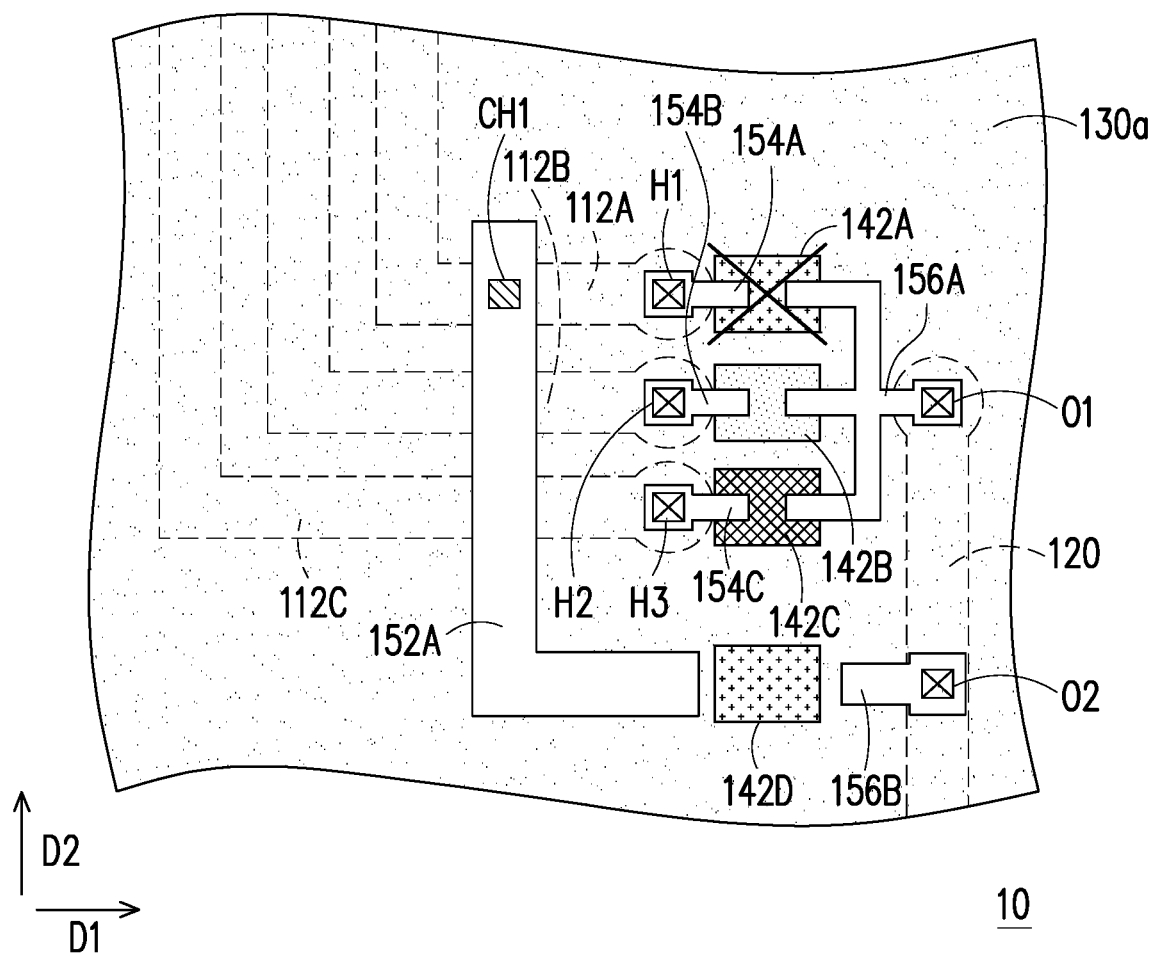
FIG. 1E to FIG. 1F are top views of a repair method of a light-emitting substrate in accordance with an embodiment of the invention.
Figure 1F:
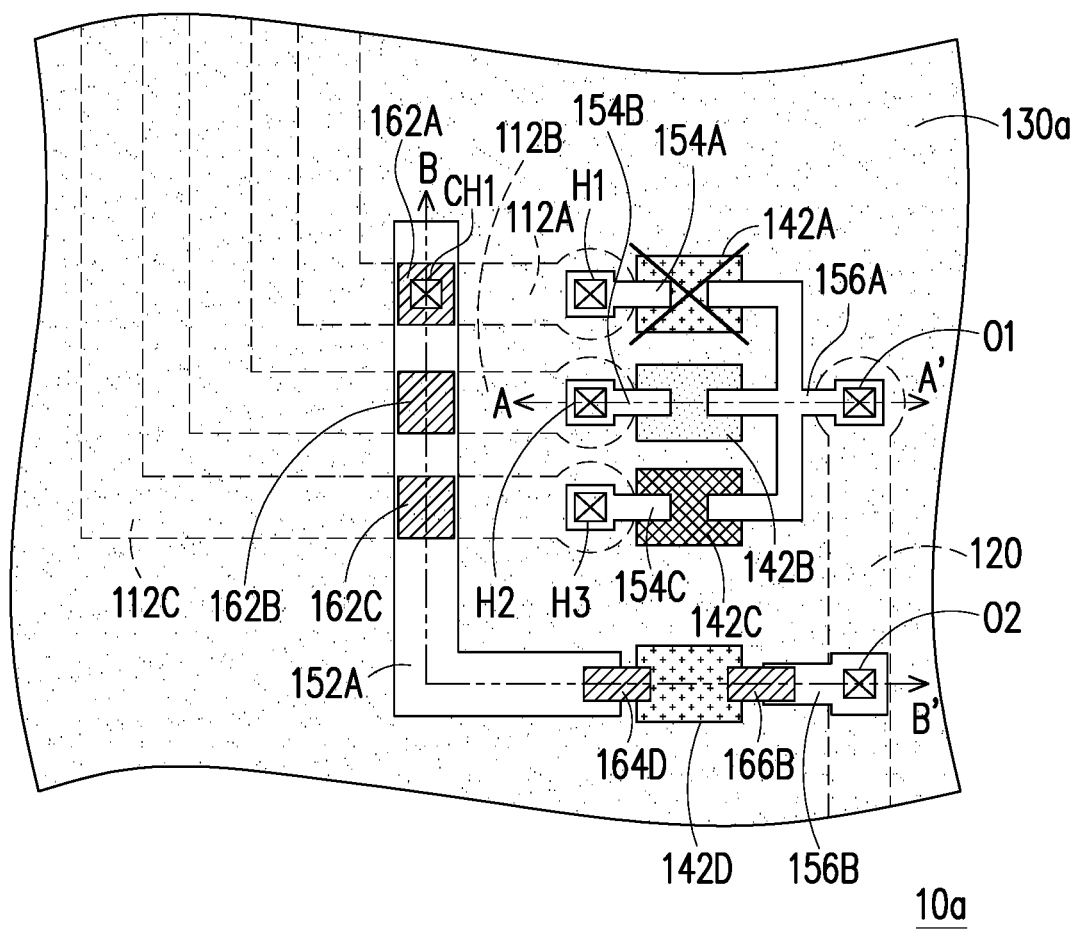

Referring to FIG. 1D, a first sub-conductive line 152A, a first connecting structure 154A, a second connecting structure 154B, a third connecting structure 154C, a fourth connecting structure 156A, and a transfer structure 156B are formed on the insulating layer 130a. The first sub-conductive line 152A, the first connecting structure 154A, the second connecting structure 154B, the third connecting structure 154C, the fourth connecting structure 156A, and the transfer structure 156B are disposed on the insulating layer 130a.

The first sub-conductive line 152A is overlapped with the first conductive line 112A, the second conductive line 112B, and the third conductive line 112C in a direction perpendicular to the substrate 100. The fourth light-emitting device placement area 102D corresponds to the positions of the first sub-conductive line 152A and the transfer structure 156B. In the present embodiment, at least a portion of the first conductive line 112A and at least a portion of the second conductive line 112B and the third conductive line 112C are extended along a first direction D1, and at least a portion of the first sub-conductive line 152A is extended along a second direction D2. The first direction D1 is staggered with the second direction D2. In the present embodiment, the first sub-conductive line 152A is located in a structural layer different from the first conductive line 112A, the second conductive line 112B, and the third conductive line 112C, thereby improving space utilization.

The first connecting structure 154A electrically connects the first light-emitting device 142A to the first conductive line 112A. The second connecting structure 154B electrically connects the second light-emitting device 142B to the second conductive line 112B. The third connecting structure 154C electrically connects the third light-emitting device 142C to the third conductive line 112C. In the present embodiment, the first connecting structure 154A, the second connecting structure 154B, and the third connecting structure 154C are filled in the openings H1 to H3 of the insulating layer 130a, respectively.

The fourth connecting structure 156A electrically connects the first light-emitting device 142A, the second light-emitting device 142B, and the third light-emitting device 142C to the signal line 120. The transfer structure 156B is electrically connected to the signal line 120. In the present embodiment, the fourth connecting structure 156A and the transfer structure 156B are filled in the openings O1 and O2 of the insulating layer 130a, respectively.

At this point, the light-emitting substrate 10 is substantially completed. In the description of FIG. 1A to FIG. 1D, the transfer of the first light-emitting device 142A, the second light-emitting device 142B, and the third light-emitting device 142C is not unsuccessful, and the first connecting structure 154A, the second connecting structure 154B, the third connecting structure 154C, and the fourth connecting structure 156A are correctly formed at predetermined positions. However, in the process of fabricating the light-emitting substrate 10, the first light-emitting device 142A, the second light-emitting device 142B, and the third light-emitting device 142C may not be smoothly transferred to the first light-emitting device placement area 102A, the second light-emitting device placement area 102B, and third light-emitting device placement area 102C. The first connecting structure 154A, the second connecting structure 154B, the third connecting structure 154C, and the fourth connecting structure 156A may not be correctly formed at predetermined positions. In addition, the first light-emitting device 142A, the second light-emitting device 142B, and the third light-emitting device 142C may themselves have a fault, such as a short circuit. The above situation may cause the first light-emitting device 142A, the second light-emitting device 142B, and the third light-emitting device 142C in the light-emitting substrate 10 to not operate normally. Therefore, it is necessary to detect the light-emitting substrate 10 to confirm whether the first light-emitting device 142A, the second light-emitting device 142B, and the third light-emitting device 142C are operating normally.

Referring to FIG. 1E, the light-emitting substrate 10 is detected, and the first light-emitting device 142A of the light-emitting substrate 10 is detected to be open-circuited. Therefore, one fourth light-emitting device 142D is supplemented in the light-emitting substrate 10. In the present embodiment, the first light-emitting device 142A and the fourth light-emitting device 142D are light-emitting diodes of the same color. The fourth light-emitting device 142D is disposed corresponding to the signal line 120. The fourth light-emitting device 142D is disposed corresponding to the first sub-conductive line 152A. In the present embodiment, an adhesive layer is formed in the opening C of the insulating layer 130a (shown in FIG. 2B), then the fourth light-emitting device 142D is placed on the adhesive layer, and the adhesive layer is cured to form an insulating layer 132a. In other embodiments, the insulating layer 130a does not have the opening C, and the insulating layer 132a is located on the insulating layer 130a. In some embodiments, the method of forming the adhesive layer includes ink-jet printing (IJP), a lithography process, or other suitable methods.

In the present embodiment, the fourth light-emitting device 142D includes the first semiconductor layer SM1, the light-emitting layer EL, the second semiconductor layer SM2, the first electrode E1, the second electrode E2, and the insulating layer I (shown in FIG. 2B). The first semiconductor layer SM1, the light-emitting layer EL, and the second semiconductor layer SM2 are stacked on each other. The light-emitting layer EL is disposed between the first semiconductor layer SM1 and the second semiconductor layer SM2. The first electrode E1 and the second electrode E2 are electrically connected to the first semiconductor layer SM1 and the second semiconductor layer SM2, respectively. The insulating layer I covers a portion of the surface of the first semiconductor layer SM1 and a portion of the surface of the second semiconductor layer SM2.

A first contact window CH1 is formed in the insulating layer 130a between the first conductive line 112A and the first sub-conductive line 152A to expose the first conductive line 112A below the insulating layer 130a. In the present embodiment, the first contact window CH1 penetrates the first sub-conductive line 152A and the insulating layer 130a. In some embodiments, the method of forming the first contact window CH1 includes laser, lithography, or other suitable processes.

Referring to FIG. 1F, FIG. 2A, and FIG. 2B, a first conductive structure 162A is formed in the first contact window CH1 to electrically connect the first conductive line 112A and the first sub-conductive line 152A.

A fifth connecting structure 164D and a sixth connecting structure 166B are formed on the fourth light-emitting device 142D. The fifth connecting structure 164D is electrically connected to the first sub-conductive line 152A and the fourth light-emitting device 142D. The sixth connecting structure 166B is electrically connected to the transfer structure 156B and the fourth light-emitting device 142D to electrically connect the signal line 120 to the fourth light-emitting device 142D.

In the present embodiment, the signal of the first conductive line 112A may be transmitted to the fourth light-emitting device 142D, so the fourth light-emitting device 142D is used to replace the open-circuited first light-emitting device 142A. In a repaired light-emitting substrate 10a, the second light-emitting device 142B, the third light-emitting device 142C, and the fourth light-emitting device 142D may emit light, and the first light-emitting device 142A does not emit light.

In the present embodiment, while the first conductive structure 162A is formed on the first conductive line 112A, a second conductive structure 162B and a third conductive structure 162C are formed on the second conductive line 112B and the third conductive line 112C, respectively. Since the insulating layer 130a and the first sub-conductive line 152A do not have contact windows corresponding to the second conductive line 112B and the third conductive line 112C, the second conductive structure 162B and the third conductive structure 162C are not in contact with the second conductive line 112B and the third conductive line 112C.

In other embodiments, the second light-emitting device 142B is open-circuited, and the first contact window CH1 is located on the second conductive line 112B, the second conductive structure 162B is filled in the first contact window CH1, and the first sub-conductive line 152A is electrically connected to the second conductive line 112B. Thereby, the open-circuited second light-emitting device 142B may be replaced with the fourth light-emitting device 142D having the same color as the second light-emitting device 142B.

In other embodiments, the third light-emitting device 142C is open-circuited, the first contact window CH1 is disposed on the third conductive line 112C, the third conductive structure 162C is filled in the first contact window CH1, and the first sub-conductive line 152A is electrically connected to the third conductive line 112C. Thereby, the open-circuited third light-emitting device 142C may be replaced with the fourth light-emitting device 142D having the same color as the third light-emitting device 142C.

Based on the above, after the light-emitting substrate is detected, the faulty light-emitting device is selectively repaired to reduce the reserved space required for repairing the light-emitting substrate, and the size of a single pixel may be reduced to improve the resolution of the light-emitting substrate. In addition, since the number of light-emitting devices needed to repair the light-emitting substrate is less, the production cost of the light-emitting substrate may be reduced. In some embodiments, the light-emitting substrate is used in a transparent display, and the transmittance of the transparent display may be improved due to fewer circuits for repair.

Figure 3:
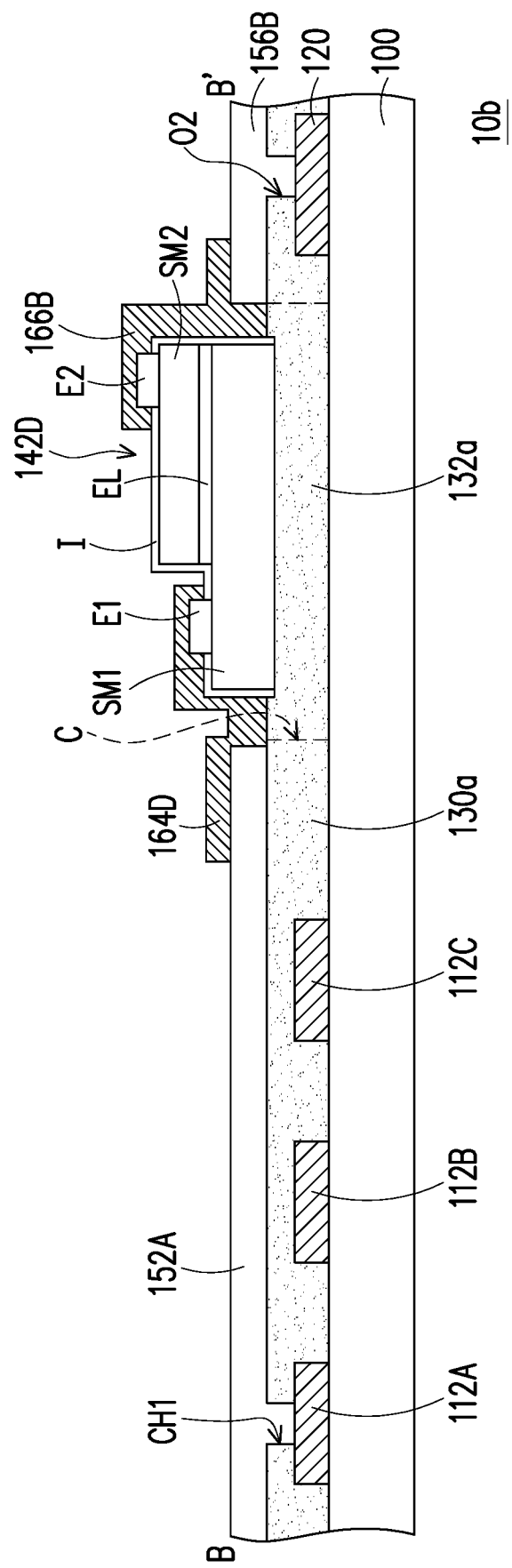
FIG. 3 is a cross section of a light-emitting substrate in accordance with an embodiment of the invention.

FIG. 3 is a cross section of a light-emitting substrate in accordance with an embodiment of the invention. It should be mentioned here that, the embodiment of FIG. 3 adopts the reference numerals of the embodiment of FIG. 2B and a portion of the content thereof, wherein the same or similar reference numerals are used to represent the same or similar devices and descriptions of the same technical content are omitted. The omitted portions are as described in the above embodiments and are not repeated herein.

The main difference between a light-emitting substrate 10b of FIG. 3 and the light-emitting substrate 10a of FIG. 2B is that the first conductive structure 162A is not formed on the first conductive line 112A of the light-emitting substrate 10b.

In the present embodiment, the first conductive line 112A and the first sub-conductive line 152A are electrically connected via the first contact window CH1 in the insulating layer 130a by laser bonding the first conductive line 112A and first sub-conductive line 152A.

Based on the above, after the light-emitting substrate is detected, the faulty light-emitting device is repaired to reduce the reserved space required for repairing the light-emitting substrate, and the size of a single pixel may be reduced to improve the resolution of the light-emitting substrate. In addition, since the number of light-emitting devices needed to repair the light-emitting substrate is less, the production cost of the light-emitting substrate may be reduced. In some embodiments, the light-emitting substrate is used in a transparent display, and the transmittance of the transparent display may be improved due to fewer circuits for repair.

Figure 4:
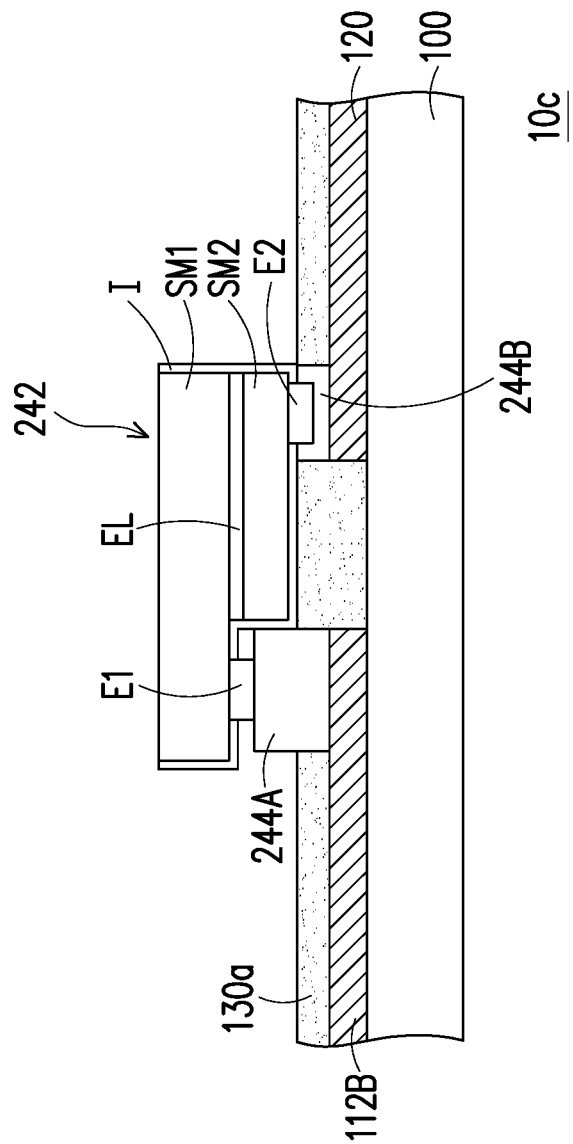
FIG. 4 is a cross section of a light-emitting substrate in accordance with an embodiment of the invention.

FIG. 4 is a cross section of a light-emitting substrate in accordance with an embodiment of the invention. It should be mentioned here that, the embodiment of FIG. 4 adopts the reference numerals of the embodiment of FIG. 2A and a portion of the content thereof, wherein the same or similar reference numerals are used to represent the same or similar devices and descriptions of the same technical content are omitted. The omitted portions are as described in the above embodiments and are not repeated herein.

The main difference between a light-emitting substrate 10c of FIG. 4 and the light-emitting substrate 10a of FIG. 2B is the light-emitting devices in the light-emitting substrate 10a (including the first light-emitting device 142A, the second light-emitting device 142B, the third light-emitting device 142C, and the fourth light-emitting device 142D) are disposed in a face-up method, and a light-emitting device 242 in the light-emitting substrate 10c is disposed in a flip chip method.

In the present embodiment, the light-emitting device 242 includes the first semiconductor layer SM1, the second semiconductor layer SM2, the light-emitting layer EL, the first electrode E1, the second electrode E2, and the insulating layer 1. The first semiconductor layer SM1, the light-emitting layer EL, and the second semiconductor layer SM2 are stacked on each other. The light-emitting layer EL is disposed between the first semiconductor layer SM1 and the second semiconductor layer SM2. The first electrode E1 and the second electrode E2 are electrically connected to the first semiconductor layer SM1 and the second semiconductor layer SM2, respectively. The insulating layer I covers a portion of the surface of the first semiconductor layer SM1 and a portion of the surface of the second semiconductor layer SM2.

The first electrode E1 of the light-emitting device 242 is electrically connected to the conductive line 112 via a solder 244A, and the second electrode E2 is electrically connected to the signal line 120 via a solder 244B.

In the present embodiment, the method of disposing the light-emitting device 242 may also be applied to the first light-emitting device 142A, the second light-emitting device 142B, the third light-emitting device 142C, and the fourth light-emitting device 142D in the foregoing embodiments.

Figure 5:
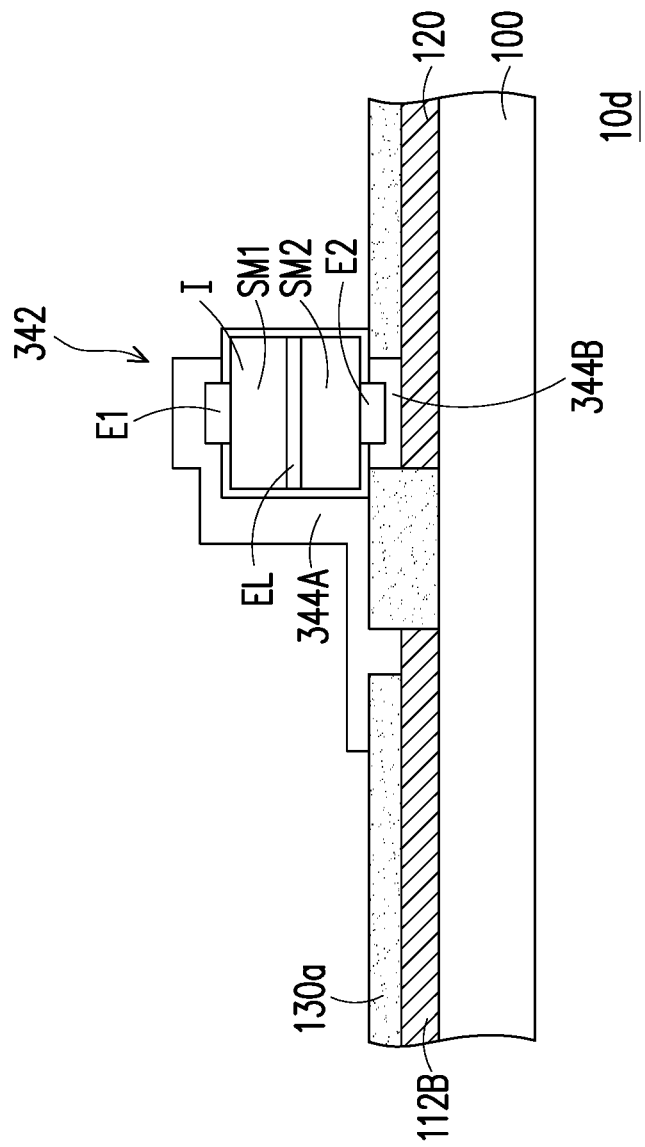
FIG. 5 is a cross section of a light-emitting substrate in accordance with an embodiment of the invention.

FIG. 5 is a cross section of a light-emitting substrate in accordance with an embodiment of the invention. It should be mentioned here that, the embodiment of FIG. 5 adopts the reference numerals of the embodiment of FIG. 2A and a portion of the content thereof, wherein the same or similar reference numerals are used to represent the same or similar devices and descriptions of the same technical content are omitted. The omitted portions are as described in the above embodiments and are not repeated herein.

The main difference between a light-emitting substrate 10*d* of FIG. 5 and the light-emitting substrate 10*a* of FIG. 2B is the light-emitting devices in the light-emitting substrate 10*a* (including the first light-emitting device 142A, the second light-emitting device 142B, the third light-emitting device 142C, and the fourth light-emitting device 142D) are horizontal light-emitting diodes, and a light-emitting device 342 in the light-emitting substrate 10*d* is a vertical light-emitting diode.

In the present embodiment, the light-emitting device 342 includes the first semiconductor layer SM1, the second semiconductor layer SM2, the light-emitting layer EL, the first electrode E1, the second electrode E2, and the insulating layer I. The first semiconductor layer SM1, the light-emitting layer EL, and the second semiconductor layer SM2 are stacked on each other. The light-emitting layer EL is disposed between the first semiconductor layer SM1 and the second semiconductor layer SM2. The first electrode E1 and the second electrode E2 are electrically connected to the first semiconductor layer SM1 and the second semiconductor layer SM2, respectively. The insulating layer I covers a portion of the surface of the first semiconductor layer SM1 and a portion of the surface of the second semiconductor layer SM2.

The first electrode E1 of the light-emitting device 342 is electrically connected to the conductive line 112 via a conductive structure 344A, and the second electrode E2 is electrically connected to the signal line 120 via a conductive structure 344B.

The light-emitting device 342 used in the present embodiment may also be applied to the first light-emitting device 142A, the second light-emitting device 142B, the third light-emitting device 142C, and the fourth light-emitting device 142D in the foregoing embodiments.

Figure 6A:
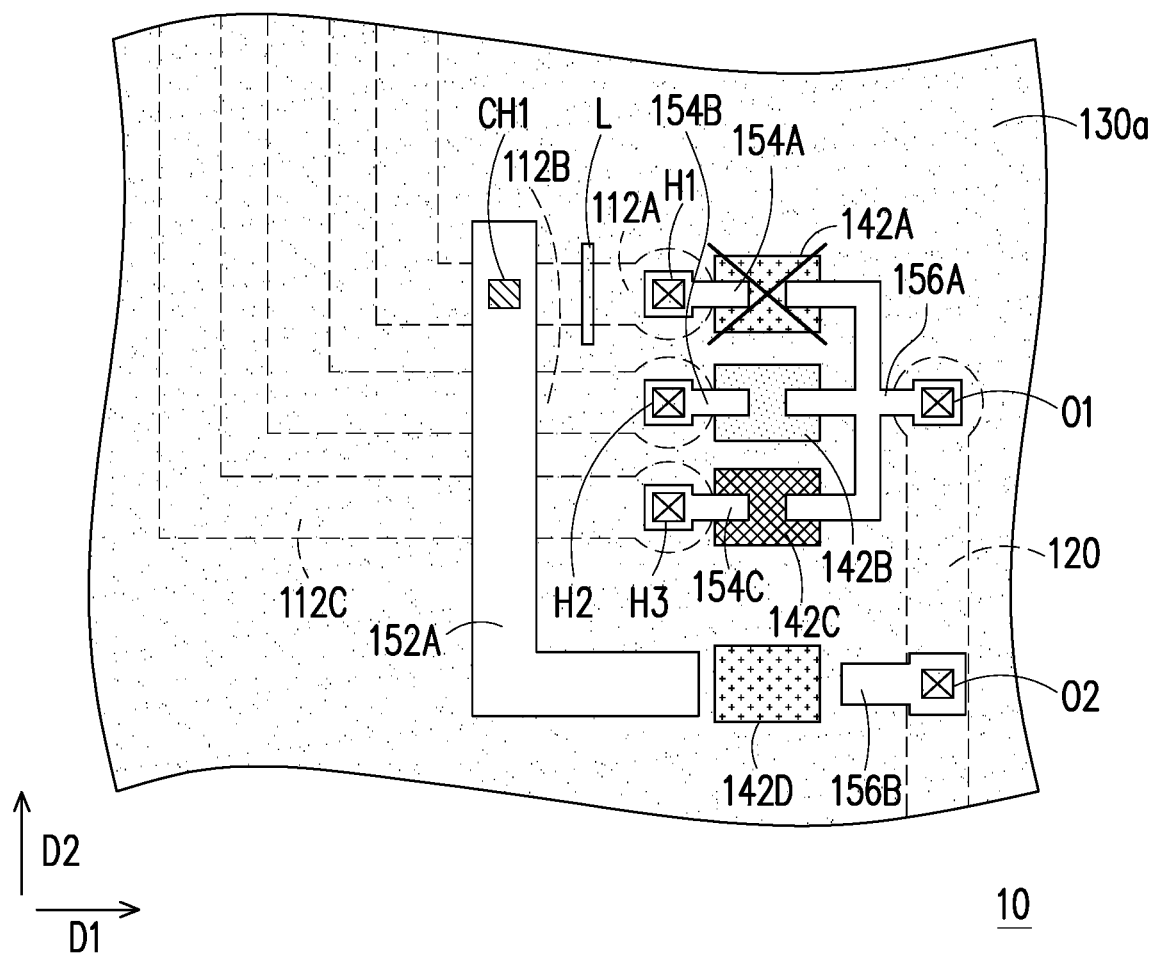
FIG. 6A to FIG. 6B are top views of a repair method of a light-emitting substrate in accordance with an embodiment of the invention.
Figure 6B:
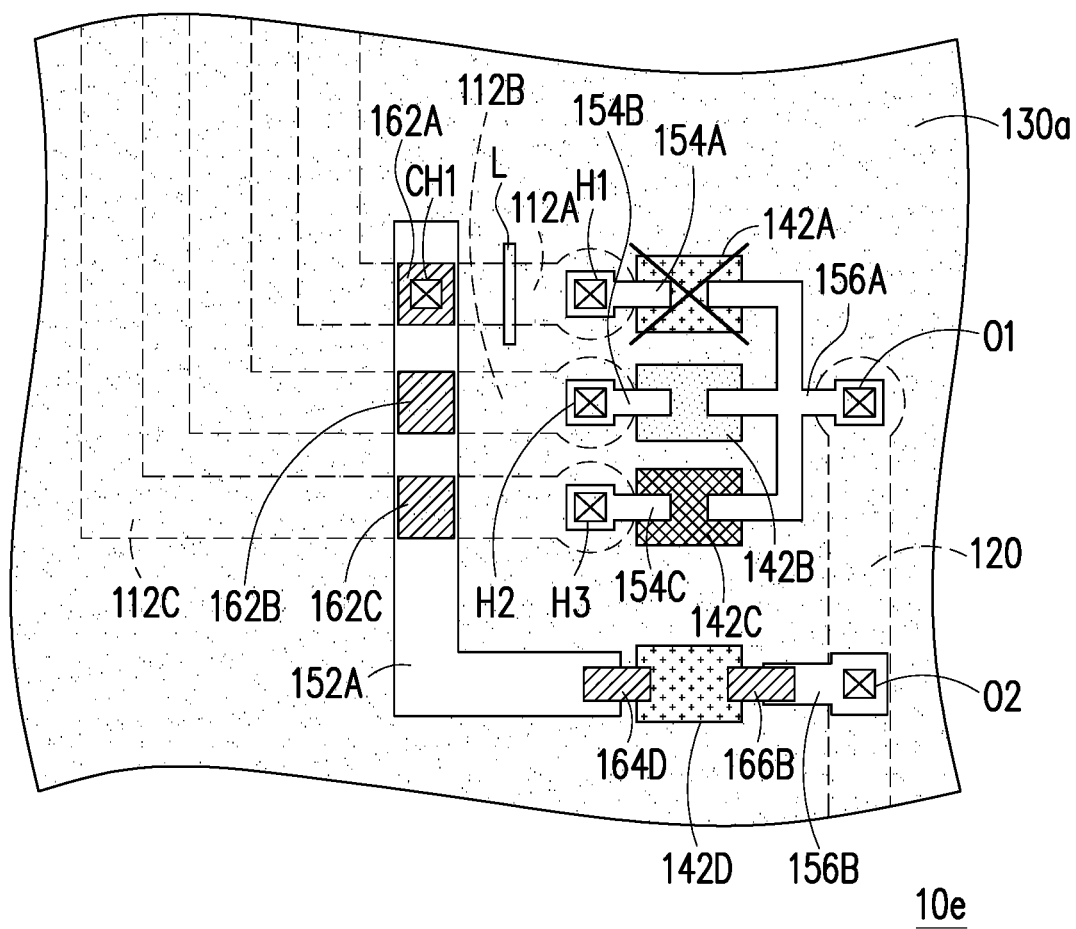

FIG. 6A to FIG. 6B are top views of a repair method of a light-emitting substrate in accordance with an embodiment of the invention. It should be mentioned here that, the embodiment of FIG. 6A to FIG. 6B adopts the reference numerals of the embodiment of FIG. 1E to FIG. 1F and a portion of the content thereof, wherein the same or similar reference numerals are used to represent the same or similar devices and descriptions of the same technical content are omitted. The omitted portions are as described in the above embodiments and are not repeated herein.

Referring to FIG. 6A, the light-emitting substrate 10 is detected to confirm whether the first light-emitting device 142A, the second light-emitting device 142B, and the third light-emitting device 142C are operating normally. In the present embodiment, the first light-emitting device 142A is observed to be short-circuited after detection. A cutting process is performed to open the first light-emitting device 142A. In the present embodiment, the first conductive line 112A is cut along a cut L to open the first conductive line 112A so that the signal of the first conductive line 112A does not flow through the first light-emitting device 142A. In other embodiments, the cut L separates the fourth connecting structure 156A from the first light-emitting device 142A such that the signal of the fourth connecting structure 156A does not flow through the first light-emitting device 142A.

One of the fourth light-emitting device 142D is supplemented in the light-emitting substrate 10. In the present embodiment, the first light-emitting device 142A and the fourth light-emitting device 142D are light-emitting diodes of the same color.

Referring to FIG. 6B, the fifth connecting structure 164D and the sixth connecting structure 166B are formed on the fourth light-emitting device 142D. The fifth connecting structure 164D is electrically connected to the first sub-conductive line 152A and the fourth light-emitting device 142D. The connecting structure 166B is electrically connected to the transfer structure 156B and the fourth light-emitting device 142D to electrically connect the signal line 120 to the fourth light-emitting device 142D.

In the present embodiment, the signal of the first conductive line 112A may be transmitted to the fourth light-emitting device 142D, so the fourth light-emitting device 142D is used to replace the short-circuited first light-emitting device 142A. In the repaired light-emitting substrate 10*e*, the second light-emitting device 142B, the third light-emitting device 142C, and the fourth light-emitting device 142D may emit light, and the first light-emitting device 142A does not emit light.

Based on the above, after the light-emitting substrate is detected, the faulty light-emitting device is repaired to reduce the reserved space required for repairing the light-emitting substrate, and the size of a single pixel may be reduced to improve the resolution of the light-emitting substrate. In addition, since the number of light-emitting devices needed to repair the light-emitting substrate is less, the production cost of the light-emitting substrate may be reduced. In some embodiments, the light-emitting substrate is used in a transparent display, and the transmittance of the transparent display may be improved due to fewer circuits for repair.

Figure 7:
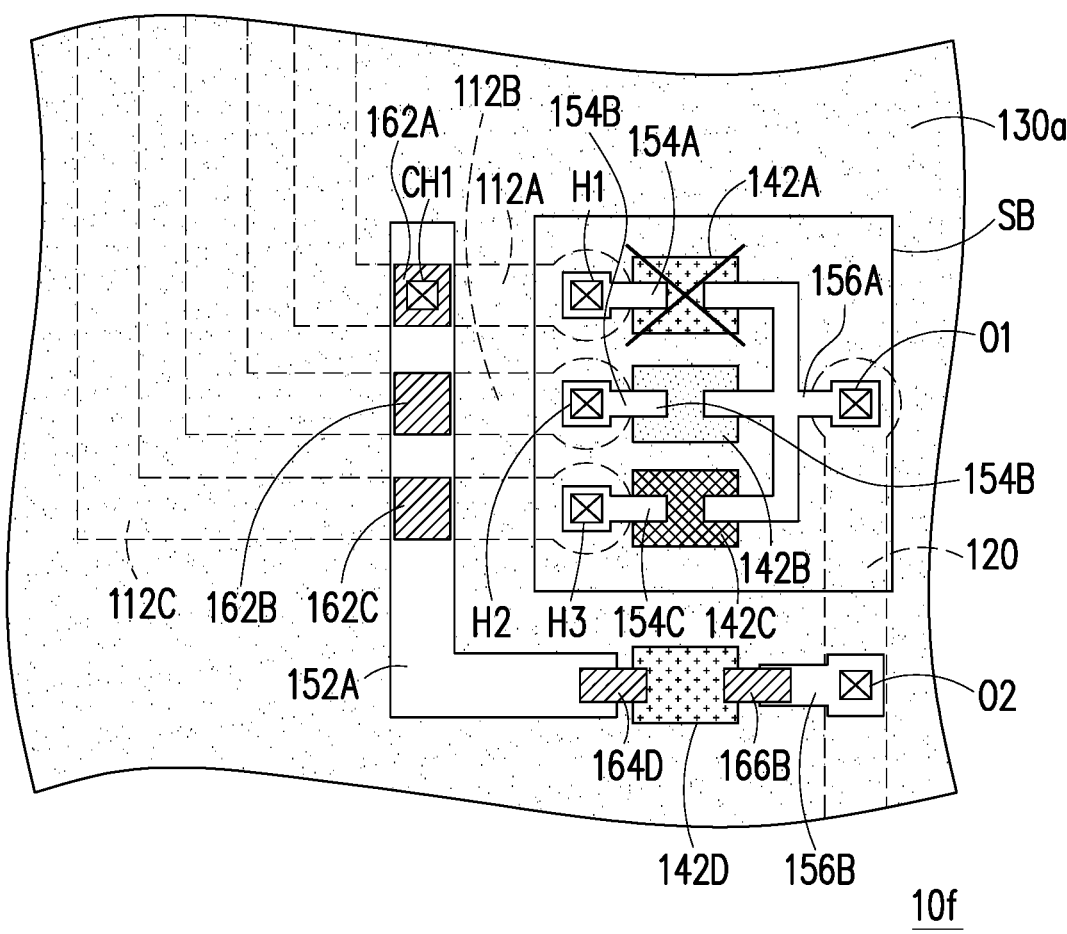
FIG. 7 is a top view of a light-emitting substrate in accordance with an embodiment of the invention.

FIG. 7 is a top view of a light-emitting substrate in accordance with an embodiment of the invention. It should be mentioned here that, the embodiment of FIG. 7 adopts the reference numerals of the embodiment of FIG. 1F and a portion of the content thereof, wherein the same or similar reference numerals are used to represent the same or similar devices and descriptions of the same technical content are omitted. The omitted portions are as described in the above embodiments and are not repeated herein.

Referring to FIG. 7, in a light-emitting substrate 10*f*, the first light-emitting device 142A, the second light-emitting device 142B, and the third light-emitting device 142C are disposed on a substrate SB. In the present embodiment, a plug-in module M including the first light-emitting device 142A, the second light-emitting device 142B, the third light-emitting device 142C, and the substrate SB is transferred onto the substrate 100.

In the present embodiment, the plug-in module M is transferred onto the substrate 100 after the first sub-conductive line 152A is formed, but the invention is not limited thereto. The plug-in module M may also be transferred onto the substrate 100 before the first sub-conductive line 152A is formed.

In the present embodiment, the second light-emitting device 142B and the third light-emitting device 142C of the plug-in module M are electrically connected to the second conductive line 112B and the third conductive line 112C, respectively, and the second light-emitting device 142B and the third light-emitting device 142C are electrically connected to the signal line 120. The first light-emitting device 142A fails (e.g., open circuit or short circuit) and does not function properly, so the first light-emitting device 142A is replaced by the fourth light-emitting device 142D.

Based on the above, after the light-emitting substrate is detected, the faulty light-emitting device is repaired to reduce the reserved space required for repairing the light-emitting substrate, and the size of a single pixel may be reduced to improve the resolution of the light-emitting substrate. In addition, since the number of light-emitting devices needed to repair the light-emitting substrate is less, the production cost of the light-emitting substrate may be reduced. In some embodiments, the light-emitting substrate is used in a transparent display, and the transmittance of the transparent display may be improved due to fewer circuits for repair.

Figure 8:
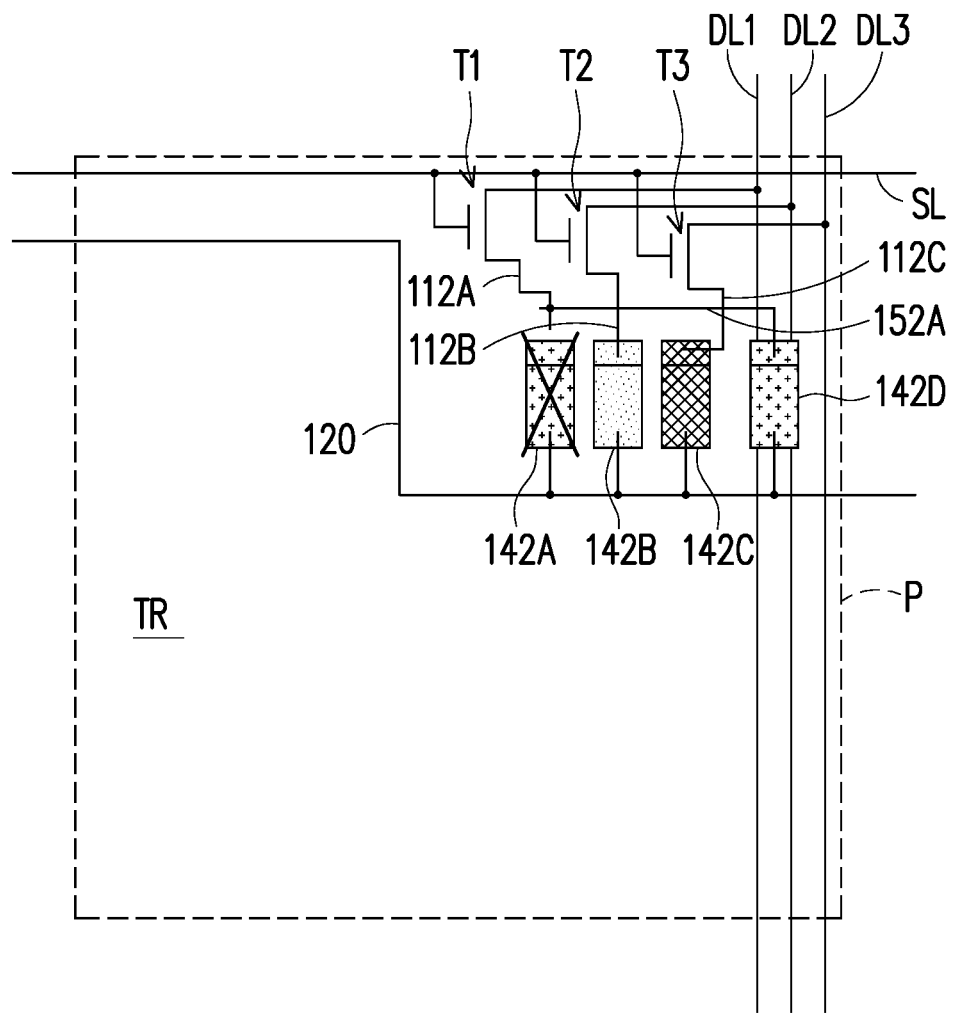
FIG. 8 is a partial circuit schematic of a light-emitting substrate in accordance with an embodiment of the invention.

FIG. 8 is a partial circuit schematic of a light-emitting substrate in accordance with an embodiment of the invention. It should be mentioned here that, the embodiment of FIG. 8 adopts the reference numerals of the embodiment of FIG. 1F and a portion of the content thereof, wherein the same or similar reference numerals are used to represent the same or similar devices and descriptions of the same technical content are omitted. The omitted portions are as described in the above embodiments and are not repeated herein.

Referring to FIG. 8, a light-emitting substrate 10g includes a pixel P. The pixel P includes the first light-emitting device 142A, the second light-emitting device 142B, the third light-emitting device 142C, the fourth light-emitting device 142D, a first switch device T1, a second switch device T2, and a third switch device T3.

In the present embodiment, the first light-emitting device 142A fails (e.g., open circuit), and the fourth light-emitting device 142D, the second light-emitting device 142B, and the third light-emitting device 142C are electrically connected to the drain of the first switch device T1, the drain of the second switch device T2, and the drain of the third switch device T3 via the first conductive line 112A, the second conductive line 112B, and the third conductive line 112C, respectively. The fourth light-emitting device 142D, the second light-emitting device 142B, and the third light-emitting device 142C are electrically connected to the signal line 120.

The source of the first switch device T1, the source of the second switch device T2, and the source of the third switch device T3 are electrically connected to a first data line DL1, a second data line DL2, and a third data line DL3, respectively. The gate of the first switch device T1, the gate of the second switch device T2, and the gate of the third switch device T3 are electrically connected to a scan line SL.

In the present embodiment, the light-emitting substrate 10g is applied in a transmissive display, and the electrode traces are arranged in a concentrated manner to enlarge and to concentrate the area of a transmission region TR in the pixel P to reduce the scattering phenomenon caused by the metal edge and improve the quality of the transmissive image display. In the present embodiment, the fourth light-emitting device 142D may be placed on a layer different from the circuit traces (for example, the first data line DL1, the second data line DL2, and the third data line DL3) to further enhance the transmittance of the display.

Based on the above, after the light-emitting substrate is detected, the faulty light-emitting device is repaired to reduce the reserved space required for repairing the light-emitting substrate, and the size of a single pixel may be reduced to improve the resolution of the light-emitting substrate. In addition, since the number of light-emitting devices needed to repair the light-emitting substrate is less, the production cost of the light-emitting substrate may be reduced. In some embodiments, the light-emitting substrate is used in a transparent display, and the transmittance of the transparent display may be improved due to fewer circuits for repair.

Figure 9:
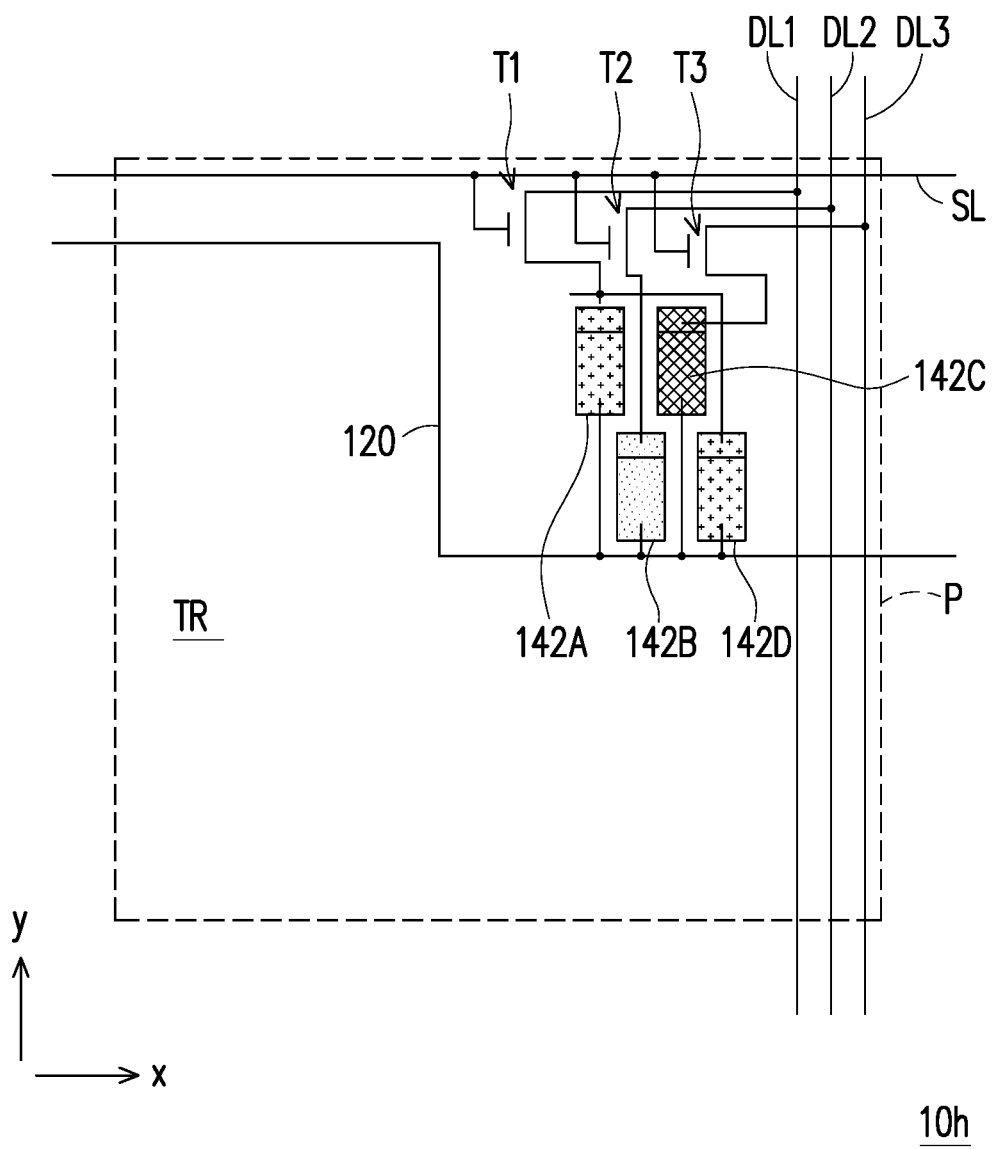
FIG. 9 is a partial circuit schematic of a light-emitting substrate in accordance with an embodiment of the invention.

FIG. 9 is a partial circuit schematic of a light-emitting substrate in accordance with an embodiment of the invention. It should be mentioned here that, the embodiment of FIG. 9 adopts the reference numerals of the embodiment of FIG. 8 and a portion of the content thereof, wherein the same or similar reference numerals are used to represent the same or similar devices and descriptions of the same technical content are omitted. The omitted portions are as described in the above embodiments and are not repeated herein.

Referring to FIG. 9, the first light-emitting device 142A, the second light-emitting device 142B, the third light-emitting device 142C, and the fourth light-emitting device 142D of a light-emitting substrate 10h are arranged in a misaligned manner.

Two of the first light-emitting device 142A, the second light-emitting device 142B, and the third light-emitting device 142C are overlapped in the x direction, and the two are overlapped with the other one of the first light-emitting device 142A, the second light-emitting device 142B, and the third light-emitting device 142C in the y direction. The fourth light-emitting device 142D is overlapped with at least one of the first light-emitting device 142A, the second light-emitting device 142B, and the third light-emitting device 142C in the x direction or the y direction.

Based on the above, the light-emitting substrate 10h has a better color mixing effect.

Figure 10:
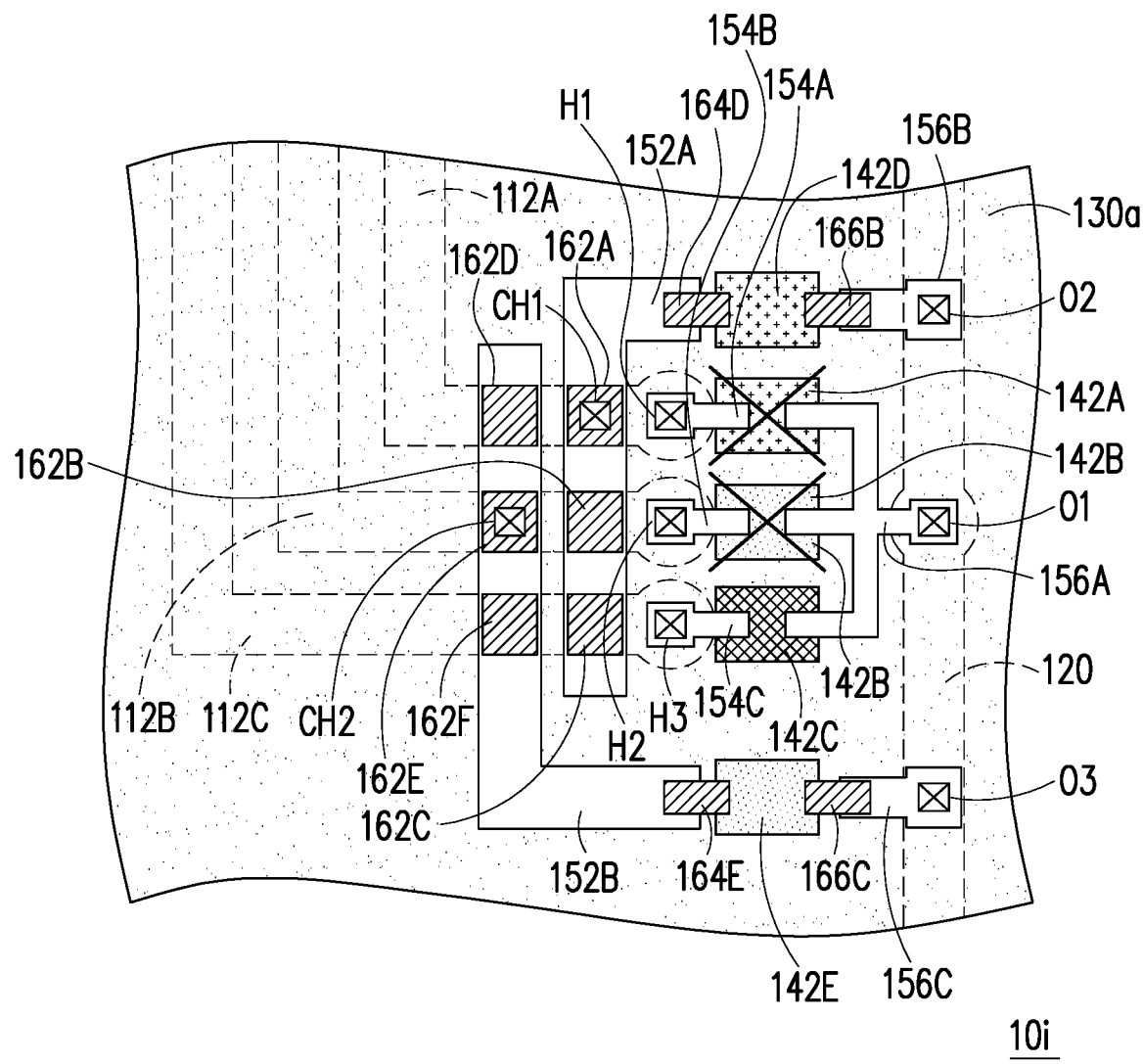
FIG. 10 is a top view of a light-emitting substrate in accordance with an embodiment of the invention.

FIG. 10 is a top view of a light-emitting substrate in accordance with an embodiment of the invention. It should be mentioned here that, the embodiment of FIG. 10 adopts the reference numerals of the embodiment of FIG. 1F and a portion of the content thereof, wherein the same or similar reference numerals are used to represent the same or similar devices and descriptions of the same technical content are omitted. The omitted portions are as described in the above embodiments and are not repeated herein.

Referring to FIG. 10, a light-emitting substrate 10i further includes a fifth light-emitting device 142E, a second sub-conductive line 152B, a transfer structure 156C, a fourth conductive structure 162D, a fifth conductive structure 162E, a sixth conductive structure 162F, a seventh connecting structure 164E, and an eighth connecting structure 166C.

The fifth light-emitting device 142E is located on the substrate 100. The second sub-conductive line 152B is located on the insulating layer 130a. The second sub-conductive line 152B is overlapped with the first conductive line 112A, the second conductive line 112B, and the third conductive line 112C in a direction perpendicular to the substrate. The fifth light-emitting device 142E is disposed corresponding to the second sub-conductive line 152B.

The fourth conductive structure 162D, the fifth conductive structure 162E, and the sixth conductive structure 162F are disposed on the second sub-conductive line 152B. The fourth conductive structure 162D, the fifth conductive structure 162E, and the sixth conductive structure 162F are overlapped with the first conductive line 112A, the second conductive line 112B, and the third conductive line 112C, respectively, in a direction perpendicular to the substrate.

In the present embodiment, the first light-emitting device 142A and the second light-emitting device 142B are faulty (e.g., open circuit). The insulating layer 130a between the first conductive line 112A and the first sub-conductive line 152A has the first contact window CH1. The first conductive structure 162A is disposed in the first contact window CH1 to electrically connect the first conductive line 112A and the first sub-conductive line 152A. The insulating layer 130a between the second conductive line 112B and the second sub-conductive line 152B has a second contact window CH2. The fifth conductive structure 162E is disposed in the second contact window CH2 to electrically connect the second conductive line 112B and the second sub-conductive line 152B.

The seventh connecting structure 164E and the eighth connecting structure 166C are located on the fifth light-emitting device 142E. The seventh connecting structure 164E is electrically connected to the second sub-conductive line 152B and the fifth light-emitting device 142E. The eighth connecting structure 166C is electrically connected to the transfer structure 156C and the fifth light-emitting device 142E, and the transfer structure 156C is electrically connected to the signal line 120 via an opening O3 of the insulating layer 130a. The first sub-conductive line 152A and the second sub-conductive line 152B are electrically connected to the fourth light-emitting device 142D and the fifth light-emitting device 142E, respectively, and the signal line 120 is electrically connected to the fourth light-emitting device 142D and the fifth light-emitting device 142E.

In the present embodiment, the fourth light-emitting device 142D and the fifth light-emitting device 142E are on opposite sides of the first light-emitting device 142A, the second light-emitting device 142B, and the third light-emitting device 142C, respectively. The first light-emitting device 142A and the fourth light-emitting device 142D are light-emitting diodes of the same color, the first light-emitting device 142A is closer to the fourth light-emitting device 142D than the second light-emitting device 142B and the third light-emitting device 142C, the second light-emitting device 142B and the fifth light-emitting device 142E are light-emitting diodes of the same color, and the second light-emitting device 142B is closer to the fifth light-emitting device 142E than the first light-emitting device 142A.

Based on the above, after the light-emitting substrate is detected, the faulty light-emitting device is repaired to reduce the reserved space required for repairing the light-emitting substrate, and the size of a single pixel may be reduced to improve the resolution of the light-emitting substrate. In addition, since the number of light-emitting devices needed to repair the light-emitting substrate is less, the production cost of the light-emitting substrate may be reduced. In some embodiments, the light-emitting substrate is used in a transparent display, and the transmittance of the transparent display may be improved due to fewer circuits for repair.

Figure 11:
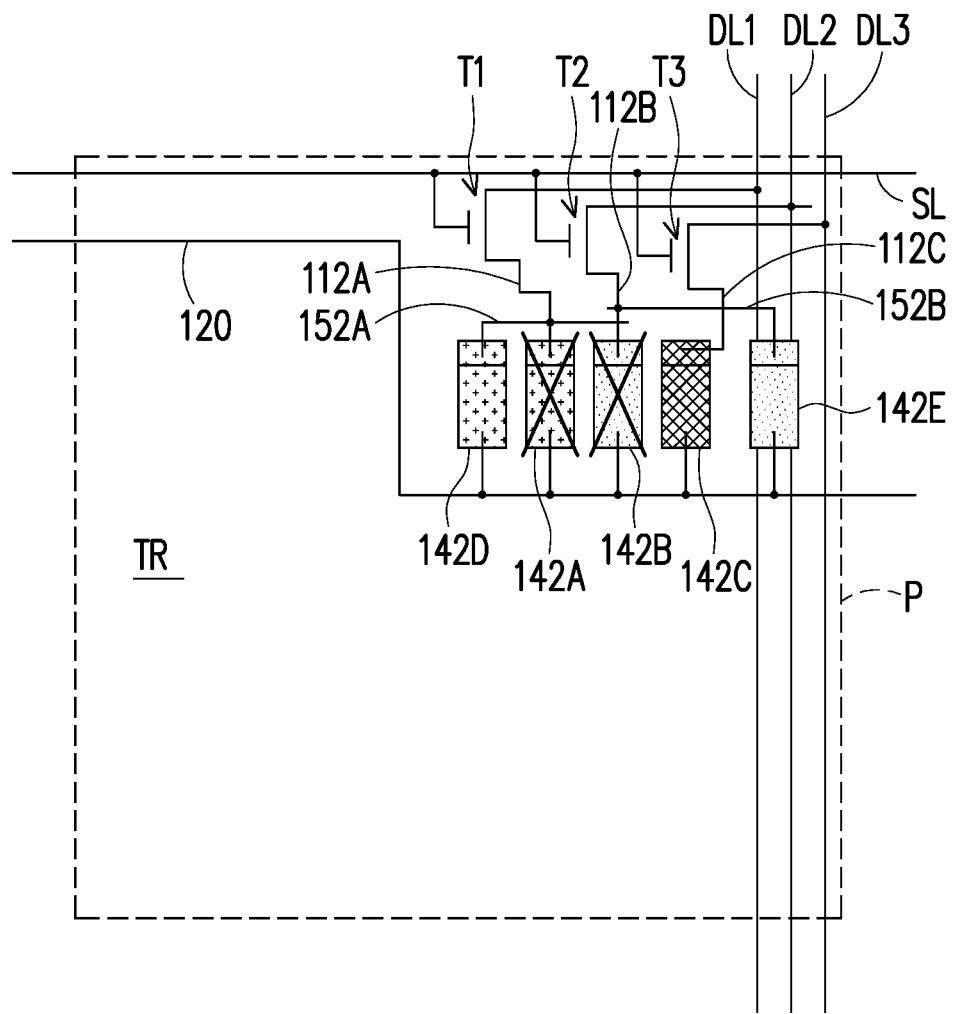
FIG. 11 is a partial circuit schematic of a light-emitting substrate in accordance with an embodiment of the invention.

FIG. 11 is a partial circuit schematic of a light-emitting substrate in accordance with an embodiment of the invention. It should be mentioned here that, the embodiment of FIG. 11 adopts the reference numerals of the embodiment of FIG. 10 and a portion of the content thereof, wherein the same or similar reference numerals are used to represent the same or similar devices and descriptions of the same technical content are omitted. The omitted portions are as described in the above embodiments and are not repeated herein.

Referring to FIG. 11, a light-emitting substrate 10j includes the pixel P. The pixel P includes the first light-emitting device 142A, the second light-emitting device 142B, the third light-emitting device 142C, the fourth light-emitting device 142D, the fifth light-emitting device 142E, the first switch device T1, the second switch device T2, and the third switch device T3.

In the present embodiment, the first light-emitting device 142A and the second light-emitting device 142B fail (e.g., open circuit), and the fourth light-emitting device 142D, the fifth light-emitting device 142E, and the third light-emitting device 142C are electrically connected to the drain of the first switch device T1, the drain of the second switch device T2, and the drain of the third switch device T3 via the first conductive line 112A, the second conductive line 112B, and the third conductive line 112C, respectively. The fourth light-emitting device 142D, the fifth light-emitting device 142E, and the third light-emitting device 142C are electrically connected to the signal line 120.

The source of the first switch device T1, the source of the second switch device T2, and the source of the third switch device T3 are electrically connected to the first data line DL1, the second data line DL2, and the third data line DL3, respectively. The gate of the first switch device T1, the gate of the second switch device T2, and the gate of the third switch device T3 are electrically connected to the scan line SL.

In the present embodiment, the light-emitting substrate 10j is applied in a transmissive display, and the electrode traces are arranged in a concentrated manner to enlarge and to concentrate the area of the transmission region TR in the pixel P to reduce the scattering phenomenon caused by the metal edge and improve the quality of the transmissive image display. In the present embodiment, the fourth light-emitting device 142D and the fifth light-emitting device 142E may be placed on a layer different from the circuit traces (for example, the first data line DL1, the second data line DL2, and the third data line DL3) to further enhance the transmittance of the display.

Based on the above, in the invention, after the light-emitting substrate is detected, the faulty light-emitting device is repaired to reduce the reserved space required for repairing the light-emitting substrate, and the size of a single pixel may be reduced to improve the resolution of the light-emitting substrate. In addition, since the number of light-emitting devices needed to repair the light-emitting substrate is less, the production cost of the light-emitting substrate may be reduced. In some embodiments, the light-emitting substrate is used in a transparent display, and the transmittance of the transparent display may be improved due to fewer circuits for repair.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A light-emitting substrate, comprising:
a substrate;
a first conductive line, a second conductive line, and a signal line disposed on the substrate;
an insulating layer disposed on the first conductive line and the second conductive line;
a first light-emitting device, a second light-emitting device, a third light-emitting device, and a fourth light-emitting device disposed on the substrate, wherein the first light-emitting device is disposed corresponding to the first conductive line, the second light-emitting device is disposed corresponding to the second conductive line, and the first light-emitting device, the second light-emitting device, the third light-emitting device, and the fourth light-emitting device are disposed corresponding to the signal line, wherein the first light-emitting device, the second light-emitting device, the third light-emitting device, and the fourth light-emitting device are disposed in one pixel;
a first sub-conductive line disposed on the insulating layer and overlapped with the first conductive line and the second conductive line in a direction perpendicular to the substrate, wherein the third light-emitting device is disposed corresponding to the first sub-conductive line; and
a second sub-conductive line disposed on the insulating layer and overlapped with the first conductive line and the second conductive line in a direction perpendicular to the substrate, wherein the fourth light-emitting device is disposed corresponding to the second sub-conductive line.

2. The light-emitting substrate of claim 1, wherein at least a portion of the first conductive line and at least a portion of the second conductive line are extended along a first direction, at least a portion of the first sub-conductive line is extended along a second direction, and the first direction is perpendicular to the second direction.

3. The light-emitting substrate of claim 1, wherein the third light-emitting device and the fourth light-emitting device are respectively at two opposite sides of the first light-emitting device and the second light-emitting device.

4. The light-emitting substrate of claim 3, wherein the first light-emitting device and the third light-emitting device are light-emitting diodes of a same color, the first light-emitting device is closer to the third light-emitting device than the second light-emitting device, the second light-emitting device and the fourth light-emitting device are light-emitting diodes of a same color, and the second light-emitting device is closer to the fourth light-emitting device than the first light-emitting device.

5. The light-emitting substrate of claim 1, wherein the first light-emitting device and the third light-emitting device are light-emitting diodes of a same color, and the first light-emitting device is closer to the third light-emitting device than the second light-emitting device.

6. The light-emitting substrate of claim 1, wherein
the insulating layer between the first conductive line and the first sub-conductive line has a contact window, and the first conductive line is electrically connected to the first sub-conductive line when the first conductive line is disconnected from first light-emitting device.

7. The light-emitting substrate of claim 6, wherein
the second conductive line and the first sub-conductive line are electrically connected to the second light-emitting device and the third light-emitting device, respectively, and the signal line is electrically connected to the second light-emitting device and the third light-emitting device.

8. The light-emitting substrate of claim 1, wherein
the insulating layer between the second conductive line and the second sub-conductive line has a contact window, and the second conductive line is electrically connected to the second sub-conductive line when the second conductive line is disconnected from the second light-emitting device.

9. The light-emitting substrate of claim 8, wherein
the first sub-conductive line and the second sub-conductive line are electrically connected to the third light-emitting device and the fourth light-emitting device, respectively, and the signal line is electrically connected to the third light-emitting device and the fourth light-emitting device.

10. The light-emitting substrate of claim 1, wherein the insulating layer is a cured adhesive layer.

11. The light-emitting substrate of claim 1, wherein when the first light-emitting device is open-circuited, the signal line is electrically connected to the second light-emitting device and the third light-emitting device, and the second conductive line and the first sub-conductive line are electrically connected to the second light-emitting device and the third light-emitting device, respectively.

12. A light-emitting substrate, comprising:
a substrate having a first light-emitting device disposed on a first light-emitting device placement area, a second light-emitting device disposed on a second light-emitting device placement area, a third light-emitting device disposed on a third light-emitting device placement area, and a fourth light-emitting device disposed on a fourth light-emitting device placement area, wherein the first light-emitting device placement area, the second light-emitting device placement area, the third light-emitting device placement area, and the fourth light-emitting device placement area are disposed in one pixel;
a first conductive line, a second conductive line, and a signal line disposed on the substrate;
an insulating layer disposed on the first conductive line and the second conductive line;
wherein the first light-emitting device placement area is disposed corresponding to the first conductive line, the second light-emitting device placement area is disposed corresponding to the second conductive line, and the first light-emitting device placement area, the second light-emitting device placement area, the third light-emitting device, and the fourth light-emitting device are disposed corresponding to the signal line;
a first sub-conductive line disposed on the insulating layer and overlapped with the first conductive line and the second conductive line in a direction perpendicular to the substrate, where in the third light-emitting device is disposed corresponding to the first sub-conductive line; and
a second sub-conductive line disposed on the insulating layer and overlapped with the first conductive line and the second conductive line in a direction perpendicular to the substrate, wherein the fourth light-emitting device is disposed corresponding to the second sub-conductive line.

* * * * *